United States Patent
Paulson et al.

(10) Patent No.: US 12,098,918 B2
(45) Date of Patent: Sep. 24, 2024

(54) IN-SITU DEPOSITION THICKNESS MONITORING

(71) Applicant: CORNING INCORPORATED, Corning, NY (US)

(72) Inventors: Charles Andrew Paulson, Painted Post, NY (US); Dean Michael Thelen, Addison, NY (US)

(73) Assignee: Corning Incorporated, Corning, NY (US)

( * ) Notice: Subject to any disclaimer, the term of this patent is extended or adjusted under 35 U.S.C. 154(b) by 130 days.

(21) Appl. No.: 17/925,182

(22) PCT Filed: Aug. 10, 2021

(86) PCT No.: PCT/US2021/045300
§ 371 (c)(1),
(2) Date: Nov. 14, 2022

(87) PCT Pub. No.: WO2022/046400
PCT Pub. Date: Mar. 3, 2022

(65) Prior Publication Data
US 2023/0184533 A1 Jun. 15, 2023

Related U.S. Application Data

(60) Provisional application No. 63/069,960, filed on Aug. 25, 2020.

(51) Int. Cl.
*G01B 7/06* (2006.01)
*C23C 16/34* (2006.01)
(Continued)

(52) U.S. Cl.
CPC .............. *G01B 7/105* (2013.01); *C23C 16/34* (2013.01); *C23C 16/36* (2013.01); *C23C 16/52* (2013.01)

(58) Field of Classification Search
CPC ........ G01B 7/105; G01B 7/107; C23C 16/34; C23C 16/36; C23C 16/52
(Continued)

(56) References Cited

U.S. PATENT DOCUMENTS 4,556,845 A 12/1985 Strope et al.
5,025,220 A * 6/1991 Colvin .................. G01N 27/07
324/444

(Continued)

FOREIGN PATENT DOCUMENTS

CN 108996465 A 12/2018
EP 2312338 A1 4/2011
(Continued)

OTHER PUBLICATIONS

International Search Report and Written Opinion of the International Searching Authority; PCT/US2021/045300; dated Feb. 1, 2022; pp. 18; European Patent Office.

(Continued)

*Primary Examiner* — Christopher P McAndrew
(74) *Attorney, Agent, or Firm* — Kevin M. Able

(57) ABSTRACT

A method for in-situ measurement of a thickness of a coating deposited by a deposition process, includes the steps of initiating deposition within a deposition chamber such that a first coating forms on an outer surface of a probe disposed in the deposition chamber, wherein the probe comprises a coil assembly including at least one coil, wherein the probe is separated by a distance from a substrate disposed within the deposition chamber; exciting the coil assembly with a first alternating current to produce a first time-varying magnetic field, the first time-varying magnetic field generating an eddy current in the first coating; determining a metric related to an inductance or resistance of the coil assembly, wherein a value of the metric is related to a first (Continued)

thickness of the first coating and results at least partially from an eddy current magnetic field produced by an eddy current in the coating; and correlating the first thickness of the first coating to a second thickness of a second coating deposited on a surface of the substrate.

16 Claims, 9 Drawing Sheets

(51) Int. Cl.
*C23C 16/36* (2006.01)
*C23C 16/52* (2006.01)

(58) Field of Classification Search
USPC .......................................................... 324/222
See application file for complete search history.

(56) References Cited

U.S. PATENT DOCUMENTS

| | | | | |
|---|---|---|---|---|
| 5,559,428 | A * | 9/1996 | Li | G01B 7/06 |
| | | | | 324/71.5 |
| 5,838,448 | A * | 11/1998 | Aiyer | G01B 11/0683 |
| | | | | 438/692 |
| 5,872,633 | A * | 2/1999 | Holzapfel | H01L 22/26 |
| | | | | 451/6 |
| 6,198,294 | B1 | 3/2001 | Black | |
| 6,407,546 | B1 | 6/2002 | Le et al. | |
| 6,707,540 | B1 * | 3/2004 | Lehman | G01N 27/72 |
| | | | | 451/6 |
| 7,112,960 | B2 * | 9/2006 | Miller | B24B 37/013 |
| | | | | 451/6 |
| 7,309,618 | B2 * | 12/2007 | Gotkis | B24B 57/02 |
| | | | | 324/229 |
| 7,349,090 | B2 * | 3/2008 | Wack | G03F 7/70708 |
| | | | | 356/369 |
| 2002/0097057 | A1 | 7/2002 | Amini | |
| 2003/0201768 | A1 * | 10/2003 | Le | G01B 7/105 |
| | | | | 324/229 |
| 2003/0206008 | A1 * | 11/2003 | Le | G01B 7/105 |
| | | | | 324/230 |
| 2003/0210041 | A1 * | 11/2003 | Le | G01B 7/105 |
| | | | | 324/230 |
| 2003/0210042 | A1 * | 11/2003 | Le | G01B 7/105 |
| | | | | 324/230 |
| 2004/0138838 | A1 * | 7/2004 | Scheiner | G01B 7/105 |
| | | | | 702/170 |
| 2004/0207395 | A1 | 10/2004 | Sarfaty et al. | |
| 2011/0089938 | A1 | 4/2011 | Schmidt | |
| 2020/0147747 | A1 | 5/2020 | Takahashi et al. | |

FOREIGN PATENT DOCUMENTS

| | | |
|---|---|---|
| FR | 1565789 A | 5/1969 |
| JP | 58-201003 A | 11/1983 |
| JP | 01-094201 A | 4/1989 |
| JP | 07-330320 A | 12/1995 |
| JP | 11-071673 A | 3/1999 |
| JP | 2002-141339 A | 5/2002 |
| JP | 2002-148010 A | 5/2002 |
| JP | 2011-064590 A | 3/2011 |
| JP | 2011-085588 A | 4/2011 |
| JP | 2020-076672 A | 5/2020 |
| WO | 2001/046684 A1 | 6/2001 |
| WO | 2013/090631 A2 | 6/2013 |

OTHER PUBLICATIONS

Invitation to Pay Additional Fees and, Where Applicable, Protest Fee; PCT/US21/45300; dated Oct. 29, 2021; 10 pages; European Patent Office.

Iwakoshi, et al., "G.Real-time measurement of W, TiN, and TaSiN thicknesses comprising full-metal gates during plasma etching by optical interference of etching plasma", Japanese Journal of Applied Physics, vol. 47, 2008, pp. 6849-6853.

Klumper-Westkamp et al., "TiNx magnetron sputter controlled by an in situ eddy current sensor", Thin Solid Films Journal, vol. 241, 1994, pp. 30-33.

Sanjay A Khan, et al., "In situ thickness monitor for conducting films", IEEE MTT-S International Microwave Symposium Digest, vol. 3, pp. 1561-1564.

Sethuraman et al., "Rapid Inversion of Eddy Current Data for Conductivity and Thickness of Metal Coatings", J. of Nondestructive Evaluation, vol. 14, 1995, pp. 39-46.

Japanese Patent Application No. 2022-568425, Office Action, dated Dec. 6, 2023, 10 pages (5 pages of English Translation and 5 pages); Japanese Patent Office.

* cited by examiner

IN-SITU DEPOSITION THICKNESS MONITORING

CROSS REFERENCE TO RELATED APPLICATION

This is a national stage application under 35 U.S.C. § 371 of International Application No. PCT/US2021/045300, filed on Aug. 10, 2021, which claims the benefit of priority under 35 U.S.C. § 119 of U.S. Provisional Application Ser. No. 63/069,960 filed on Aug. 25, 2020, the content of which is relied upon and incorporated herein by reference in their entireties.

BACKGROUND

Field

This application generally relates to in-situ deposition thickness monitoring, and, more particularly, to an in-situ deposition thickness monitoring system that determines the thickness of a wear-resistant coating on a substrate, such as an extrusion die, while the substrate is disposed in a deposition chamber.

Technical Background

Wear-resistant coatings may be used in manufacturing processes, for example, in order to extend the life of a tool, such as an extrusion die in a ceramic honeycomb body manufacturing process. Processes to apply such coatings, such as chemical vapor deposition processes, may require high temperatures and harsh environments that make it infeasible to measure the thickness of a coating material deposited on a tool or other substrate.

SUMMARY

All examples and features mentioned below can be combined in any technically possible way.

According to an aspect, a method for in-situ measurement of a thickness of a coating deposited by a deposition process, includes the steps of: initiating deposition within a deposition chamber such that a first coating forms on an outer surface of a probe disposed in the deposition chamber, wherein the probe comprises a coil assembly including at least one coil, wherein the probe is separated by a distance from a substrate disposed within the deposition chamber; exciting the coil assembly with a first alternating current to produce a first time-varying magnetic field, the first time-varying magnetic field generating an eddy current in the first coating; determining a metric related to an inductance or resistance of the coil assembly, wherein a value of the metric is related to a first thickness of the first coating and results at least partially from an eddy current magnetic field produced by an eddy current in the coating; and correlating the first thickness of the first coating to a second thickness of a second coating deposited on a surface of the substrate.

In an example, the metric is an impedance or transimpedance of the coil assembly.

In an example, the metric is a frequency at which a resonant peak occurs.

In an example, the metric is a coefficient of a polynomial fit to a curve of the impedance or transimpedance of the coil assembly at a plurality of frequencies.

In an example, the probe comprises a housing having a body and a cap, wherein the outer surface of the probe is an outer surface of the housing, wherein the coil assembly is disposed in the housing.

In an example, the at least one coil is operatively coupled to at least one capacitor to form a resonant circuit.

In an example, the distance is at least three times a radius of the at least one coil.

In an example, the at least one coil is wound about a threaded mandrel such that the at least one coil is restrained in an axial direction.

In an example, the coil assembly comprises a first coil and a second coil.

In an example, the first coil and the second coil are wound about an axis, wherein the first coil is spaced apart from the second coil to define a gap therebetween, wherein a third coil is disposed in the gap between the first coil and the second coil.

In an example, the method further includes the step of exciting the second coil with a second alternating current, the second alternating current flowing in a direction opposite to the first alternating current to produce a second time-varying magnetic field that at least reduces the first time-varying magnetic field in the gap between first coil and the second coil, wherein the first alternating current excites the first coil.

In an example, the first coil is wound about the axis in a first direction and the second coil is wound about the axis in a second direction.

In an example, the first coil and the second coil are formed from the same conducting wire such that first alternating current and the second alternating current are the same.

According to another aspect, an electrical probe for measuring the thickness of a coating, includes: a first coil being wound about an axis in a first direction and having a first number of turns; a second coil being wound about the axis in a second direction and having a second number of turns, wherein the first coil is spaced apart from the second coil to define a gap therebetween, wherein the first direction is opposite the second direction such that a first time-varying magnetic field generated by a first alternating current flowing through the first coil reduces, in the gap, a second time-varying magnetic field generated by a second alternating current flowing through the second coil; and a third coil disposed in the gap between the first coil and the second coil, wherein a coating deposited on an outer surface of the electrical probe measurably changes a metric related to a mutual inductance between the third coil and the first coil and the second coil during operation.

In an example, the first coil and the second coil are formed by the same wire such that the first alternating current and the second alternating current are the same.

In an example, the first number of turns are the same as the second number of turns.

In an example, at least one of the first coil, the second coil, or the third coil is operatively connected to at least one capacitor to form a resonant circuit.

In an example, the first coil, the second coil, and the third coil are housed in a housing comprising a body and a cap.

In an example, the cap is removable from the body.

In an example, the first coil, the second coil, and the third coil are wound about a threaded mandrel such that the first coil, the second coil, and the third coil are restrained in an axial direction.

According to another aspect, a deposition system providing in-situ measurement of deposition thickness, includes: a deposition chamber dimensioned to receive a substrate and having an inlet that receives a chemical vapor to apply a coating to a surface of the substrate; an electrical probe positioned in the chemical vapor deposition chamber such that an outer surface of the electrical probe is coated by the chemical vapor, wherein the electrical probe comprises a coil assembly including at least one coil, wherein the probe is separated by a distance from the substrate; and a signal generator supplying an alternating current signal to the coil assembly to generate a first time-varying magnetic field such that eddy currents are generated in the coating on the surface of the electrical probe.

In an example, the probe comprises a housing, wherein the outer surface of the probe is an outer surface of the housing, wherein the coil assembly is disposed on the housing.

In an example, the housing comprises a body and a cap.

In an example, the at least one coil is operatively coupled to at least one capacitor to form a resonant circuit.

In an example, the distance is at least three times a radius of the at least one coil.

In an example, the at least one coil is wound about a threaded mandrel such that the at least one coil is restrained in an axial direction.

In an example, the probe comprises a first coil and a second coil.

In an example, the first coil and the second coil are wound about an axis, wherein the first coil is spaced apart from the second coil to define a gap therebetween, wherein a third coil is disposed in the gap between the first coil and the second coil, wherein the coating deposited on the outer surface of the electrical probe measurably changes a metric related to mutual inductance between the third coil and the first coil and the second coil.

In an example, the first coil is wound about the axis in a first direction and the second coil is wound about the axis in a second direction.

In an example, the first coil and the second coil are formed from the same conducting wire such that first alternating current and the second alternating current are the same.

The details of one or more implementations are set forth in the accompanying drawings and the description below. Other features, objects, and advantages will be apparent from the description and the drawings, and from the claims.

DETAILED DESCRIPTION

Ceramic honeycomb bodies, such as those used in catalytic converters and/or particulate filters, can be produced by extruding a ceramic-forming batch mixture through a die. Based on the raw materials in the ceramic-forming batch mixture the extrusion process may be highly abrasive, in which case it may be advantageous to coat the die with a wear resistant coating. For example, a coating can be applied using a chemical vapor deposition process (CVD) with a coating material such as titanium nitride (TiN), titanium carbon nitride (TiCN), or other nitrides or abrasion-resistant materials, to protect the die from abrasion, maintain dimensional accuracy throughout the extrusion process, and extend the life of the die. In addition to protecting the die from abrasion, the coating also serves to fine-tune (i.e., narrow) the slot widths of the die through which the ceramic batch material is extruded. The slot widths are tuned to a highly exacting thickness—the applied coating is typically only less than 50 µm in thickness—and so the thickness of the coating must be monitored closely during the deposition process.

However, it is not feasible to measure the thickness of the coating during the deposition process, for example due to the high temperature and harsh conditions during coating. In lieu of measuring the thickness, the coating may be applied over a set time period that has previously been correlated to an approximate thickness based on approximated deposition rates. The thickness of the coating can be measured optically once the die has been removed from the deposition chamber and, e.g., allowed to cool to room temperature.

Figure 1A:
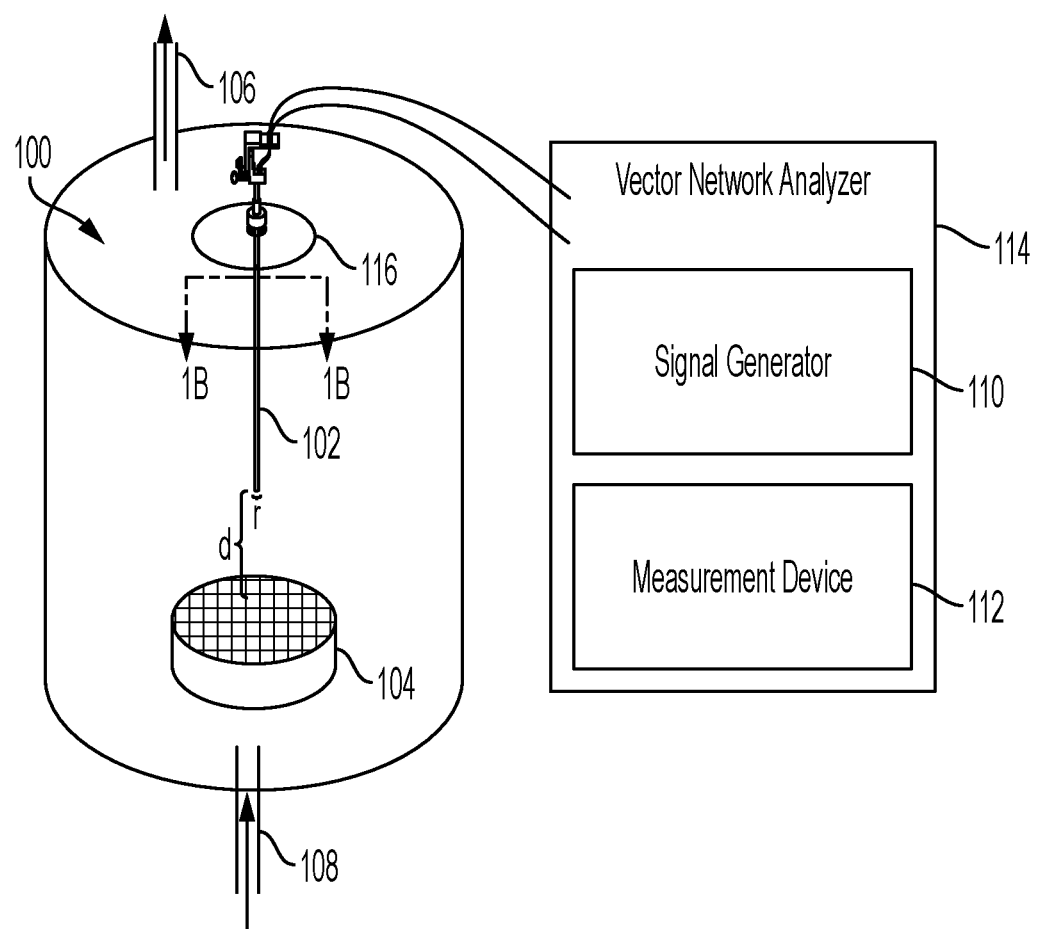
FIG. 1A is a schematic view of deposition chamber and probe for in-situ measurement of a coating thickness on a substrate, according to an example.

FIG. 1A is schematic view of a deposition chamber 100 with a probe 102 for in-situ measurement of the coating thickness on a substrate 104 disposed in the deposition chamber 100. Deposition chamber 100, in the example of FIG. 1, is a chemical vapor deposition chamber, and, as such, includes an inlet 106 for receiving a chemical vapor and an outlet 108 for exhausting the vapor during the deposition process. The probe 102 is particularly suited for chemical vapor deposition processes, but the probe 102 can be used with other coating processes, e.g., requiring high temperatures or harsh environments, that make it infeasible to measure the thickness of a coating during the coating process. Other such deposition processes include, e.g., sputtering and evaporation. Furthermore, in one example, substrate 104 is an extrusion die for extruding a green ceramic body, e.g., a green honeycomb body, although in alternative examples, substrate 104 can any substrate, e.g., tool or workpiece, receiving a deposited coating.

Probe 102 is at least partially positioned within chamber 100 so as to also receive a coating during the deposition process. The thickness of the coating deposited on probe 102 itself will be related to the thickness of the coating deposited on substrate 104, and thereby can serve as a proxy for measuring the thickness of a coating disposed on substrate 104. In this way, the in-situ measurement of the thickness of the coating on substrate 104 is determined by measuring a thickness of a coating on probe 102.

Figure 1B:
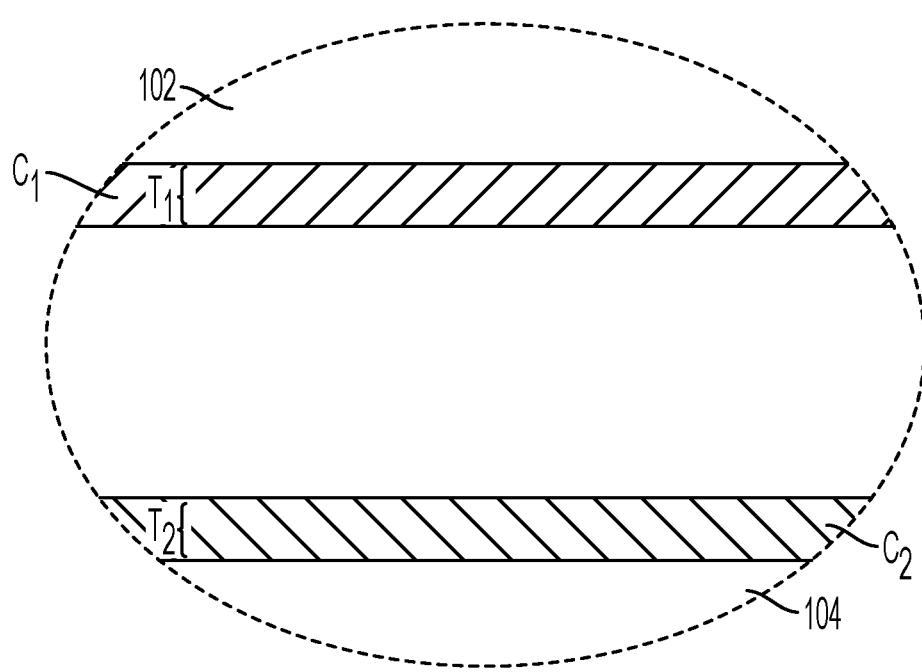
FIG. 1B depicts of a magnified cross-section view of a coating deposited on the surface of a probe and of a coating deposited on the surface of a substrate, according to an example.

FIG. 1B shows a schematic magnified view of coatings on the surfaces of probe 102 and substrate 104 (which have been illustrated in close proximity to each other for the sake of comparison of the surfaces of probe 102 and substrate 104). As shown, during the deposition process probe 102 receives coating $C_1$ with a thickness $T_1$ and substrate 104 receives coating $C_2$ with a thickness $T_2$. The thickness $T_1$ is related to thickness $T_2$, due to the probe 102 also being located within deposition chamber 100, and thus the thickness $T_2$ can be effectively monitored during the deposition process by monitoring the thickness $T_1$. For example, thickness $T_1$ can be related to thickness $T_2$ by a scaling factor, through the addition of a constant, or a linear or nonlinear function, which can be, e.g., determined experimentally or via modeling, based on the particular geometries of the chamber 100, the substrate 104, the probe 102, the positioning of the substrate 104 and the probe 102 within the chamber 100, and/or the deposition parameters, such as coating material type, temperature, flow rate, etc.

According to some embodiments, probe 102 is an electrically reactive probe, including at least one inductive element and/or at least one capacitive element. As the coating $C_1$ is deposited on the surface of probe 102, a reactance of the at least one capacitive element and/or the at least one inductive element changes as a result of a magnetic or electrical field generated by the coating $C_1$ in response to an alternating current flowing through the probe 102. The change in the reactance will be related to a change in thickness of the coating deposited on the surface of the probe, and thus the thickness of the coating disposed on substrate 104 can be approximated by monitoring the change in reactance of probe 102 during the deposition process. As will be described in more detail below, the thickness can be determined according to various metrics related to the reactance or resistance of probe 102. These metrics can be, in various examples, an impedance or transimpedance, a frequency at which a resonant peak occurs, or at least one coefficient of a polynomial fit to a curve of the impedance or transimpedance of probe 102 over a range of frequencies; however, it is contemplated that other metrics could be used. For the purposes of this disclosure, a metric related to a reactance or resistance of the probe is one that reproducibly (and thus predictably) changes with reactance and from which the thickness of the coating can be inferred.

A signal generator 110 can provide the alternating current through probe 102 that induces the magnetic or electric field in the coating and that, in turn, changes the reactance of probe 102. Any signal generator suitable for delivering an alternating current to probe 102 can be used. Furthermore, any suitable measurement device 112 for measuring one or more parameters from which the metric related to the reactance or resistance of probe 102 can be determined can be used. In one example, signal generator 110 and measurement device 112 can together be provided by a vector network analyzer 114. However, one of ordinary skill in the art, in conjunction with a review of this disclosure, will appreciate that there a myriad of ways of implementing a signal generator and for measuring the parameters from which the metric can be determined. For example, signal generator 110 can alternatively be implemented by a local oscillator. Likewise, measurement device 112 can be implemented as an impedance bridge circuit or a lock-in amplifier.

As shown, probe 102 can be inserted into deposition chamber 100 by way of a feedthrough 116, e.g., a hermetic feedthrough. The feedthrough 116 permits probe 102 to be inserted into deposition chamber 100 while maintaining the vacuum created in deposition chamber 100. In one example, the feedthrough 116 is a KF fitting, although CF fittings, or any O-ring that can withstand the temperatures existing within deposition chamber 100 can be used, e.g., to maintain a hermetic seal.

As shown in FIG. 1A, probe 102 is disposed remote from substrate 104 such that a distance d exists between the probe 102 and substrate 104. Locating the probe 102 remote from substrate 104 can be useful to reduce the perturbation of the deposition on substrate 104. For example, where the deposition process is accomplished through chemical vapor deposition, additional surface area within deposition chamber 100 may "steal" away chemical vapor from substrate 104, lowering the concentration of chemical vapor within deposition chamber 100 and lowering the deposition rate. Positioning another object, e.g., the probe 102, close to the substrate 104 may cause boundary flow effects, or otherwise impede, block, alter, or disrupt flow patterns near the substrate 104, and thus coating thickness at various locations on the substrate 104, Positioning probe 102 remote from substrate 104 reduces such perturbation, thus helping to maintain the concentration of chemical of chemical vapor at substrate 104 and maintain a consistent deposition rate across the entirety of the substrate 104. In one example, distance d is at least three times the radius r (or otherwise, the width, in examples in which probe 102 is not cylindrical) of probe 102.

To further reduce the perturbance of the flow of chemical vapor, probe 102 can be shaped to have a longitudinal axis A, shown in the example cross-section view of probe 102 in FIG. 1, oriented parallel to the flow of vapor. Further, the radius r of probe 102 (or otherwise, the width, in examples in which probe 102 is not cylindrical) can be minimized, resulting in a geometric profile that minimally impacts the flow of chemical vapor.

Figure 2:
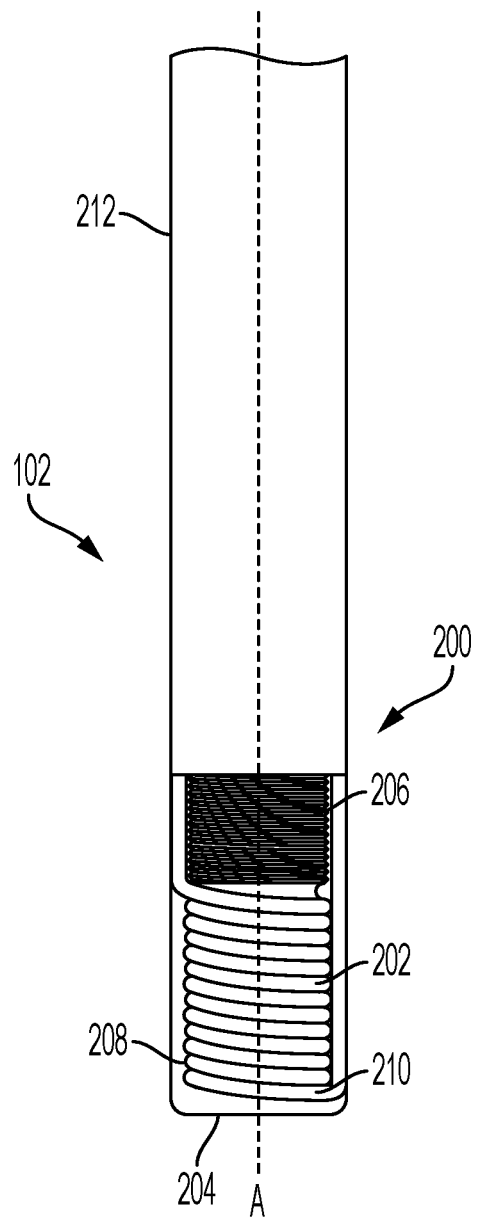
FIG. 2 depicts a cross-section view of an example probe for in-situ measurement of a coating thickness on a substrate, according to an example.

FIG. 2 shows a cross-section view of one example of probe 102. In this example, probe 102 is an inductive probe featuring a housing 200 in which a coil assembly 202 is disposed. In alternative examples, a capacitive assembly, rather than or in addition to a coil assembly 202, can be disposed in the housing. During the deposition process, an outer surface 204 of housing 200 is the surface of probe 102 coated during the deposition process. Housing 200 can comprise a body 206 and a cap 208 fit over coil assembly 202 and removably attached to body 206. The removable attachment of cap 208 permits rapid turnover time between applications. For example, after a deposition process, cap 208 can be quickly removed and either cleaned (e.g., removing coating $C_1$ using an etching bath, physical force, or other stripping treatment) and reattached to housing 200 or a different cap 208 (e.g., new or previously cleaned), can be attached to housing 200. In an example, cap 208 can be attached to body 206 to way of a threaded connection, although in various alternative examples any mechanical connection that can be maintained through the deposition process can be used.

Housing 200, cap 208, and other parts of probe 102, not including the inductive or capacitive elements, can be formed of ceramic or other material having low coefficient of thermal expansion, as these perform well in the high-temperature environment of deposition chamber 100.

Maintaining a fixed coil geometry can be beneficial to maintain accuracy during and across tests, e.g., particularly where high temperatures are utilized during the deposition process. As shown in FIG. 2, the coil(s) of coil assembly 202 can be wound about a threaded mandrel 210, in which at least one turn of the coil is seated in a respective thread, thus restraining coil assembly 202 from axial movement (i.e., movement along the longitudinal axis A) during the deposition process. Because the deposition chamber 100 can reach as much as 900° C., the turns of coil assembly 202 are prone to drift as a result of thermal expansion. Threaded mandrel 210 eliminates or otherwise reduces this axial drift and thus retains the distance between respective turns of coils assembly 202. Furthermore, housing 200 (e.g., cap 208) can be tightly fitted over coil assembly 202 to eliminate or reduce radial expansion of coil assembly 202. In an alternative example, coil assembly 202 can be potted in a potting material (e.g., a thermosetting plastic or epoxy) in order to restrain coils from drifting due to thermal expansion.

Figure 3A:
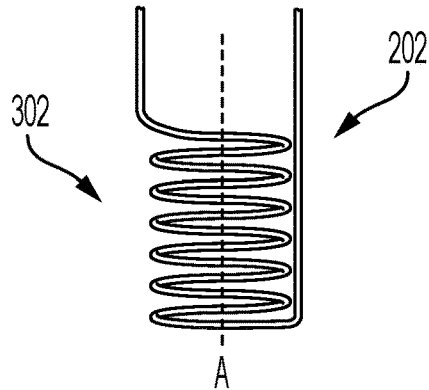
FIG. 3A depicts a side view of a coil assembly for in-situ measurement of a coating thickness on a substrate, according to an example.
Figure 3B:
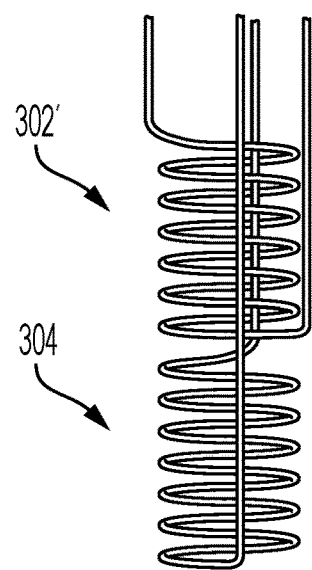
FIG. 3B depicts a side view of a coil assembly for in-situ measurement of a coating thickness on a substrate, according to an example.
Figure 3C:
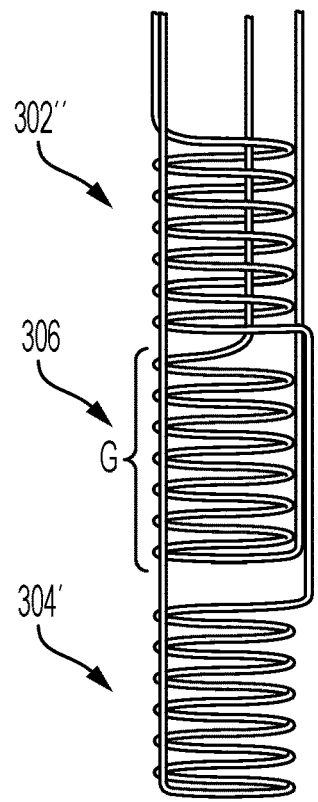
FIG. 3C depicts a side view of a coil assembly for in-situ measurement of a coating thickness on a substrate, according to an example.

FIGS. 3A-3C show several alternative example coil topologies of coil assembly 202. The topologies of FIGS. 3A-3C shown removed from housing 200 and threaded mandrel 210 so that the topologies can be easily observed. Turning first to FIG. 3A, there is shown an example single coil topology comprising a first coil 302. In this example, the alternating current flowing through first coil 302 generates a time-varying magnetic field that creates eddy currents in the coating $C_1$ forming on outer surface 204. The eddy currents, in turn, create an opposing magnetic field that alters the self-inductance of first coil 302. The magnitude of the eddy currents and of the magnetic field they create will be determined at least in part by the thickness of the coating forming on outer surface 204, and thus the thickness $T_1$ of coating $C_1$ can be monitored by determining the change in a metric related to self-inductance or resistance of first coil 302 (such as impedance).

FIG. 3B shows an alternative example featuring two coils, a first coil 302' and a second coil 304. When an alternating current is flowing through one of first coil 302' and second coil 304, the resulting time-varying magnetic field will generate a voltage across the other coil 302', 304. Thus, for example, if an alternating current is flowing through first coil 302', the resulting time-varying magnetic field will cause a voltage to form across second coil 304, which will induce a current through second coil 304, forming a second time-varying magnetic field. The eddy currents in coating $C_1$ that ultimately form from the either first time-varying magnetic field or the second will alter the self-inductance of the coils 302', 304 individually and the mutual inductance between the coils 302', 304 because the eddy current magnetic field steals away or adds to the time-varying magnetic fields that would otherwise couple first coil 302' or second coil 304. Thus, the thickness $T_1$ of coating $C_1$ can be monitoring by monitoring a metric related the self-inductance or resistance of the coils 302', 304 individually (e.g., impedance) or the mutual inductance between coils 302', 304 (e.g., transimpedance).

In the example of FIG. 3B, first coil 302' and second coil 304 are both shown disposed along the same longitudinal axis A; however, in alternative examples, first coil 302' and second coil 304 can be disposed along separate axes. For example, in an alternative example, first coil 302' and second coil 304 can be disposed along parallel axes.

FIG. 3C depicts another example of a topology of coil assembly 202 in which a first coil 302" and second coil 304' are separated by some distance forming a gap g in which a third coil 306 is disposed. The first coil 302" and second coil 304', as shown in this example, are formed from the same conductive wire, so that the same current flows through each. The coils in this embodiment are wound in opposite directions in order to produce opposing magnetic fields in the gap. The opposing magnetic fields will reduce the effect of the time-varying magnetic fields produced by the first coil 302" and second coil 304' within gap g, and, thus, on third coil 306, which is formed of a separate conductive wire, thereby canceling (or reducing) the mutual inductance between third coil 306 and first coil 302" and second coil 304'. Because the mutual inductance is canceled at third coil 306 when no coating is present, even minute changes to the metrics related to self-inductance or resistance of third coil 306 (e.g., impedance) or by metrics related to the mutual inductance between third coil 306 and first coil 302" and second coil 304' (e.g., transimpedance) will be readily detectable.

The topology of FIG. 3C is only one example of a method for canceling or reducing the mutual inductance at third coil 306. In an alternative example, rather than using counter wound coils that are formed from a common conductive wire, first coil 302" and second coil 304' can be formed from separate conductive wires, and be wound in the same direction, but receive current flowing in opposing directions (i.e., the alternating current flowing through the first coil 302" is approximately 180° out of phase with alternating current flowing second coil 212'). Assuming that the currents are approximately 180° (±10°) out of phase and of equal magnitude, the effects of the time-varying magnetic fields at third coil 306 will be reduced, similar to the example of FIG. 3C. In various alternative examples, the currents through first coil 302" and second coil 304' can be out of phase by some value besides approximately 180° and/or need not receive currents of equal magnitude. Further, in yet another example, first coil 302" and second coil 304' can be formed of independent conductive wires and be counter wound, so that current of the same magnitude and phase flowing through each will similarly cause canceling or reduction of mutual inductance at third coil 306.

Figure 4:
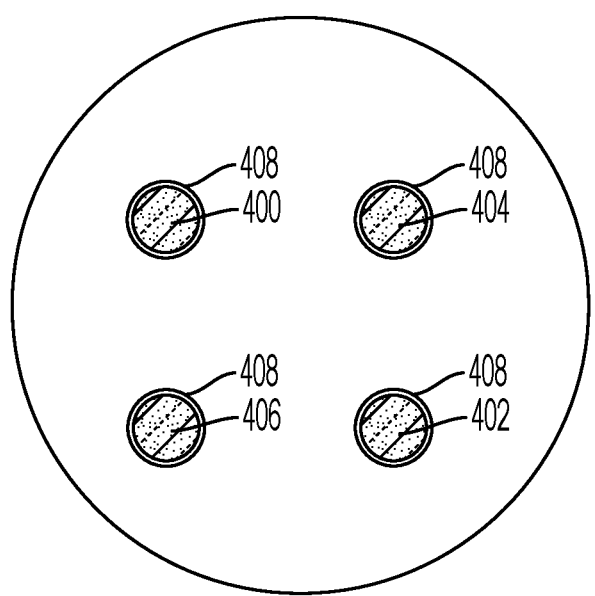
FIG. 4 depicts a cross-section view of a probe stalk, according to an example.

The geometry of the conductive wires that connect probe 102 to signal generator 110 and to measurement device 112 can be held in a fixed geometry. An example is shown in FIG. 4, which depicts a cross-section view of probe 102, taken along line B-B. As shown, first conductive wire 400, second conductive wire 402, third conductive wire 404, and fourth conductive wire 406, which are formed from the leads of first coil 302 and second coil 304 (e.g., arranged in the geometries of FIG. 3B or 3C) are respectively arranged in channels 408 extending parallel to the longitudinal axis A of stalk 212 of probe 102. First conductive wire 400 and second conductive wire 402 form input and output leads of first coil 302, while third conductive wire 404 and fourth conductive wire 406 form input and output leads of second coil 304. Arranged in the manner shown in FIG. 4, background transmissive coupling is substantially reduced, as the magnetic fields generated by the transmission of the alternating currents to first coil 302 or second coil 304 are effectively canceled by the return of the same current in an opposing wire. Thus, any time-varying magnetic field generated by the alternating current input to first coil 302 by first conductive wire 400, is effectively canceled at third conductive wire 404 and fourth conductive wire 406 by the time-varying magnetic field generated by the same current returning in second conductive wire 402. Likewise, the time-varying magnetic field generated by an alternating current input to third conductive wire 404 is effectively canceled at first conductive wire 400 and second conductive wire 404 by the same alternating current returning in the fourth conductive wire 406. The cancelling is maintained by the fixed geometry in which the conductive wires are held via channels 408. Furthermore, the stalk 212 of probe 102 can be configured to be of a length such that the canceling effect is maintained for a distance enough to reduce or minimize uncancelled background transmissive coupling effects on probe 102. Thus, in one example, stalk 212 is at least a half a meter in length, although other lengths that enable or enhance such cancelling are within the scope of this disclosure.

As mentioned above, the temperature inside the deposition chamber can reach as much as 900° C. As such, the long stalk 212 length (that is at least greater than half a meter) further helps to manage the thermal gradient in the hot deposition chamber 100.

Turning now to determining a metric related to a reactance or resistance of probe 102. As described above, for the purpose of this disclosure, the metric related to a reactance (e.g., inductance, such as self-inductance or mutual inductance, or capacitance) or resistance of the probe is any metric that predictably changes with reactance or resistance and from which the thickness of the coating can be inferred. The reactance can be a capacitive reactance (for a capacitive probe), an inductive reactive (for an inductive probe), or some combination of capacitive or inductive reactance (e.g., an LC circuit).

While any number of metrics can be used, three metrics were shown to reliably determine the thickness $T_1$ of coating $C_1$: (1) the change in impedance or transimpedance over time, (2) the frequency at which a resonant peak occurs, and (3) the curvature of the impedance or transimpedance of the probe over frequency.

Figure 5:
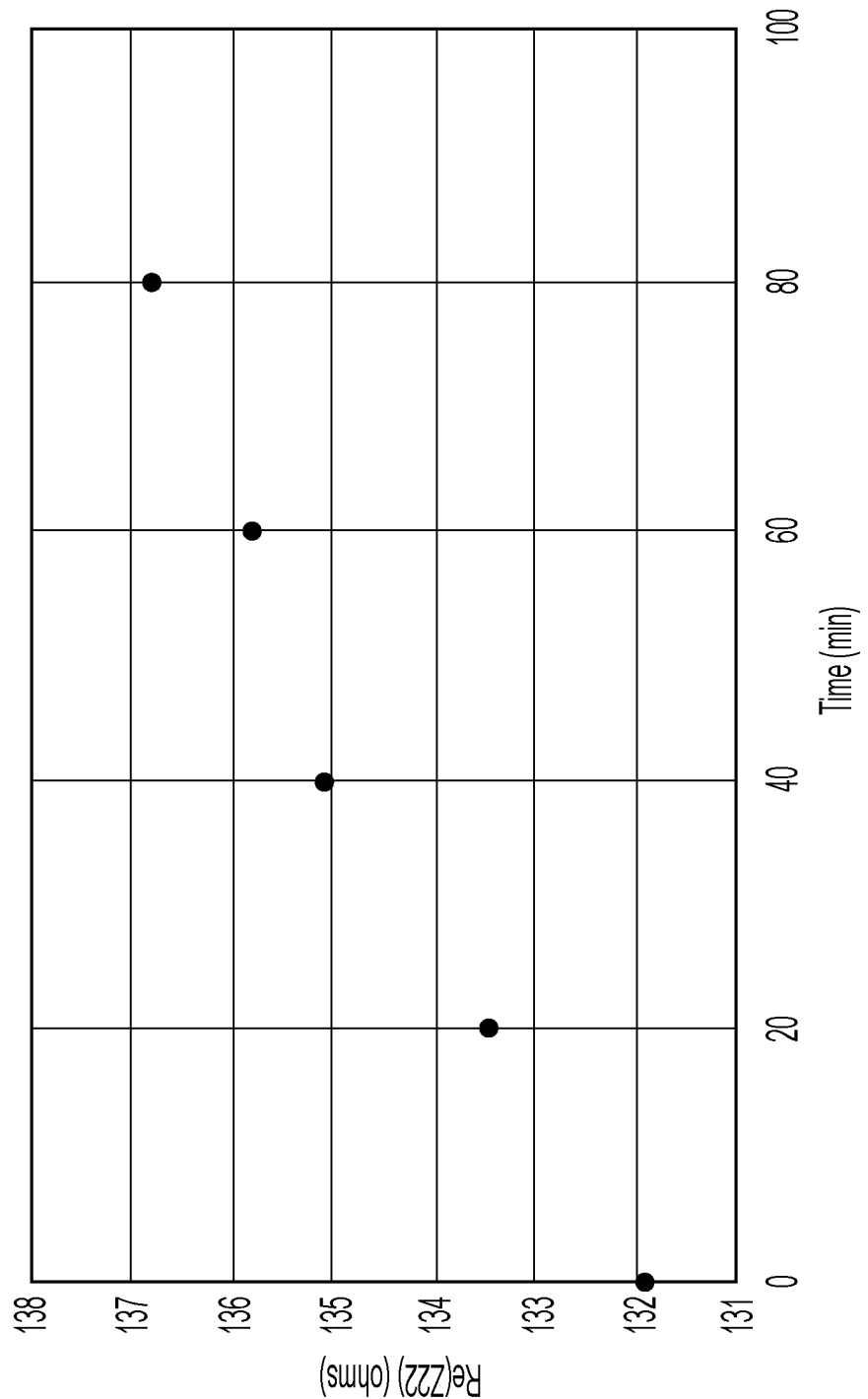
FIG. 5 depicts a plot of an impedance curve over time, according to an example.

Turning first to the change in impedance or transimpedance or time. As shown in FIG. 5, the change in impedance of a coil or the transimpedance between two coils is correlated to coating thickness. Such a change can be seen in FIG. 5 which plots the impedance of a single coil over a period of approximately 80 minutes during a deposition process. During this time frame, the impedance changes from approximately 132Ω to approximately 13Ω, according to the change in coating thickness.

Turning to the next metric, probe 102 will exhibit some resonance, manifesting in a resonant peak at a particular frequency that changes depending on the thickness of the coating on probe 102. To understand this, the angular resonant frequency of an LC circuit, which probe 102 can be roughly modeled as, is given by $$\omega_0 = \frac{1}{\sqrt{LC}},$$

and so the frequency at which the resonant peak occurs will change with the reactance (either inductance or capacitance) of probe 102. Thus, as the thickness of coating increases, altering the reactance of probe 102, the resonant peak will shift in a related manner.

Figure 6:
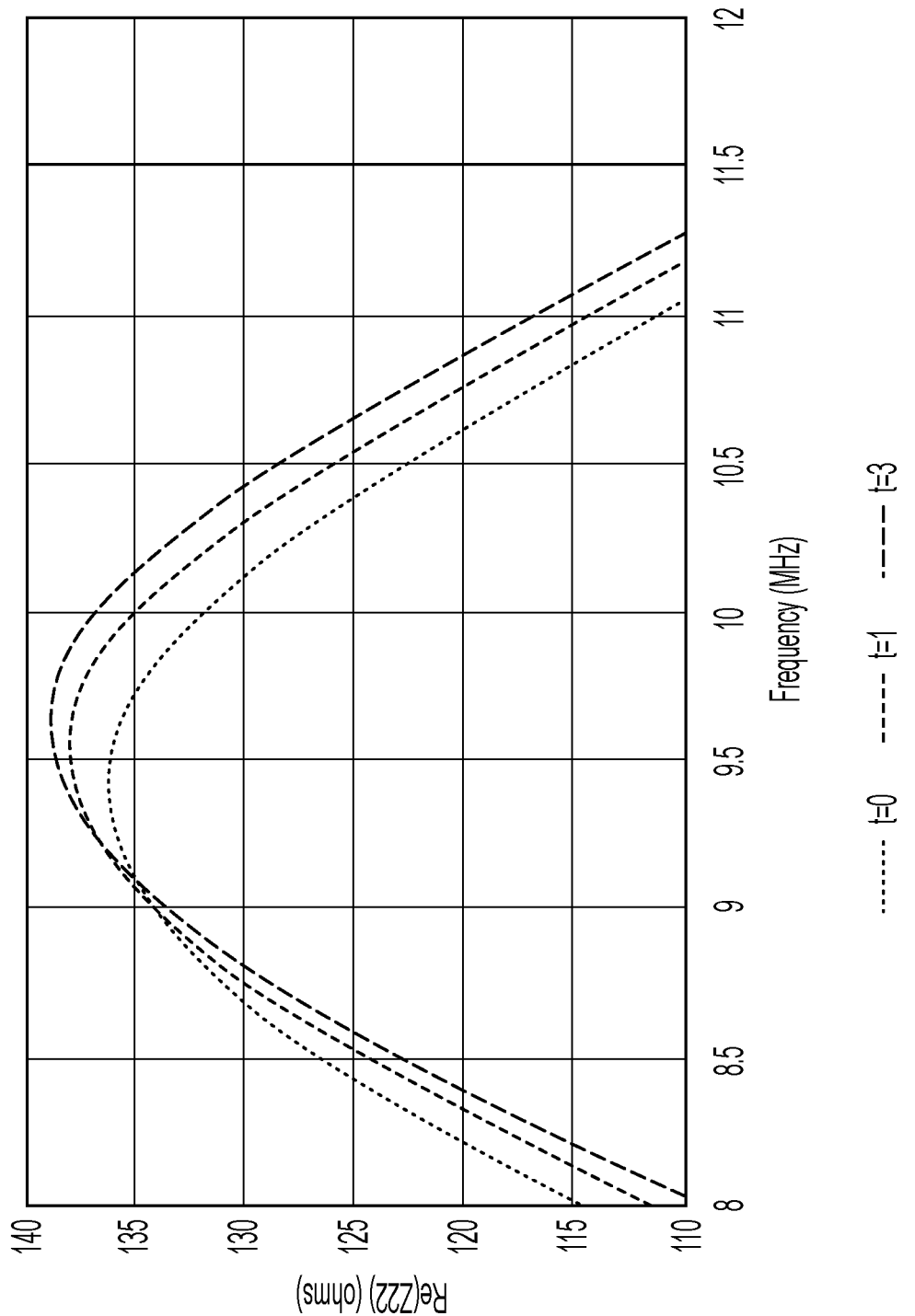
FIG. 6 depicts a plot of overlaid resonant curves taken over the course of a deposition process, according to an example.

More specifically, as the thickness $T_1$ of coating $C_1$ increases over time, the frequency $f_p$ at which the resonant peak occurs will increase. As an example of this, FIG. 6 depicts an three overlaid resonant curves taken at separate times throughout the deposition process: a first curve at time t=0, representing the resonant curve at a time before deposition begins and having a resonant peak occurring at approximately 9.4 MHz, a second curve at time t=1, representing the resonant curve at some time (approximately 20 minutes) after deposition has started and having a resonant peak occurring at frequency approximately 9.5 MHz, and a third resonant curve taken at time t=2, representing the resonant curve toward the end of the deposition process (approximately 20 minutes after the second resonant curve) and having a resonant peak occurring at frequency 9.6 MHz. As shown, the resonant peak frequency of the third resonant curve is higher than the resonant peak frequency of the first and second resonant curves as the resonant peak has shifted due to the change in thickness of the coating deposited on probe 102. Accordingly, the frequency at which the resonant peak occurs will shift in time in a manner related to the thickness of the coating $C_1$. Experimentally, the resonant frequency tends to change about 30 kHz per minute for a coating rate of about 51 nm per minute.

The frequency at which the resonant peak occurs can be determined, in one example, by exciting probe 102 over a range of frequencies in which the resonant peak is expected to occur and recording the frequency at which the peak is measured. This frequency sweep can be repeated multiple times over the course of the deposition process to track the change in thickness of coating $C_1$ over time. Alternatively, probe 102 can be excited with an alternating current of a single frequency. For example, as long as the frequency at which probe 102 is excited resides in the resonant curve, the resulting change in impedance can be measured and related to its relative location within the curve. Because the width of the resonant curve will remain largely unchanged as the thickness of coating $C_1$ increases, a change in measured in impedance can be easily related to a relative position within the resonant curve, and, accordingly, to a corresponding thickness of the coating $C_1$.

In either instance, a lookup table can be used to relate the frequency at which the resonant peak occurs $f_p$ to a thickness $T_1$ of coating $C_1$. Alternatively, a different part of the resonant curve (e.g., the 3 dB point), rather than the peak, can be correlated to thickness $T_1$. In the example in which a single frequency is used instead of a frequency sweep, the measured impedance, representative of a position within the resonant curve, can be used as the input parameter to the lookup table to determine the thickness $T_1$ directly.

In general, following Lenz's law, higher frequency time-varying magnetic fields create higher electromotive force. Thus, as frequency increases, more current is induced the coating, resulting in greater change in the reactance of probe 102 resulting in better sensitivity for higher frequency values. However, skin depth $\delta$, (i.e., the penetration depth of the time-varying magnetic field into coating $C_1$) is given by $1/\sqrt{\mu 2 f \rho}$, where $\mu$ represents and thus the penetration of the time-varying magnetic field decreases as the frequency increases. If the time-varying magnetic field fails to penetrate the entire depth of the coating, the change in the thickness will not induce a continued change in the reactance of probe 102. Accordingly, the higher sensitivity at higher frequencies needs to be balanced against the diminished skin depth at the same frequencies. Empirically, the range of suitable frequencies was found to be between 100 kHz and 1 GHz, while a frequency of approximately 10 MHz was found to achieve the best sensitivity while retaining a sufficient skin depth. The above values are only given as examples and the frequency range can be selected depending on the particular geometries of probe 102, coating materials, and/or other operational parameters.

Figure 7:
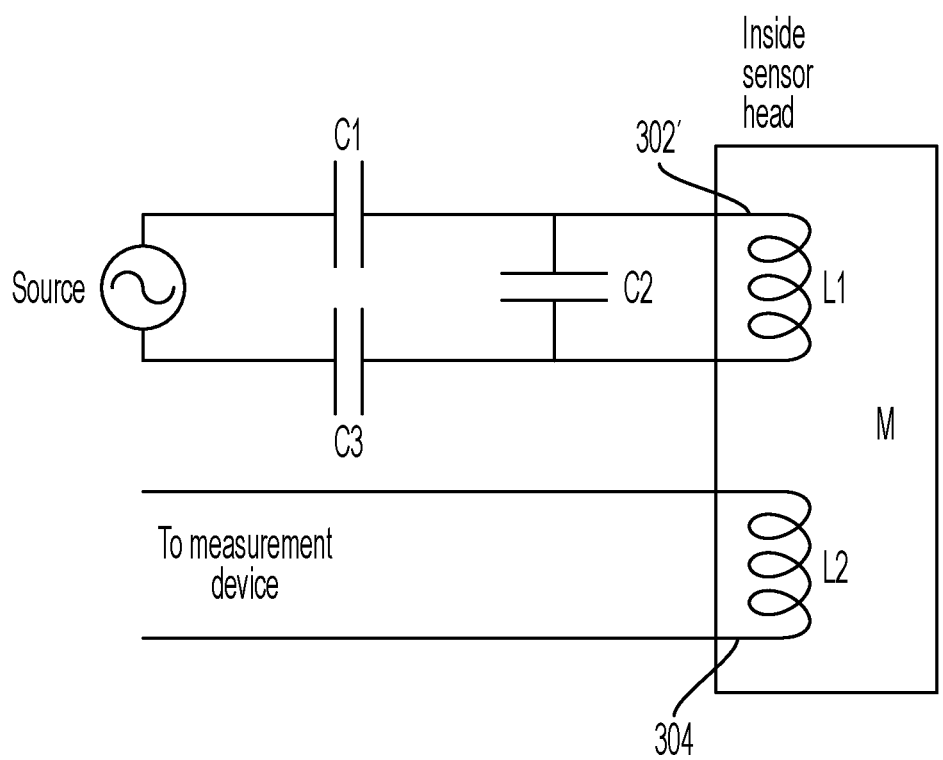
FIG. 7 depicts a matched network, according to an example.

In order to ensure that the resonant peak occurs approximately at a desirable frequency (i.e., one that maintains sufficient skin depth, such as on or about 10 MHz), a matched network, such as matched network 600 shown in the circuit schematic of FIG. 7 can be employed. Matched network 600 comprises an LC circuit formed of elements C1, C2, and C3, which effectively shifts the resonant peak of probe to approximately 10 MHz by varying the total reactance seen by measurement device 102. Although matched network 500 is a T-matching network, any suitable matching network for changing the resonant peak to a desired value can be used. Furthermore, although the matched network is shown attached to first coil 302' in the coil assembly example described in connection with FIG. 3B, it should be understood that the matched network can be suitably attached to any coil of the coil assembly. For example, in the coil assembly example of FIG. 3C the matched network can operatively be connected to any of first coil 302", second coil 304', or third coil 306. (In this example, the connection to the first coil 302" and second coil 304' is electrically equivalent because they are formed from the same wire.)

In a second example, the thickness $T_1$ can be determined from the shape of a curve that represents the impedance or transimpedance measured against a set of frequencies that includes a frequency in which coupling between probe 102 and coating $C_1$ begins. At low frequencies (including DC currents) the current through probe 102 will be insufficient cause measurable coupling between probe 102 and coating $C_1$. As these frequencies increase, coupling will begin as the time-varying magnetic field reaches and penetrates coating $C_1$. Furthermore, as the excitation frequency changes, the impedance or transimpedance, measured against frequency, will change as coupling increases due to the higher generated electromotive force (under Lenz's law, as described above). The impedance plotted against frequency will form a curve from which the thickness can be determined. The shape of this curve, measured over a frequency band including the frequency at which the coupling begins, will vary as the thickness increases. Thus, over the course of the deposition process, multiple frequency sweeps can yield a curve of the impedance over frequency, the shape of each curve being a metric representative a reactance, and thus the thickness of the coating deposited, on probe 102.

Figure 8:
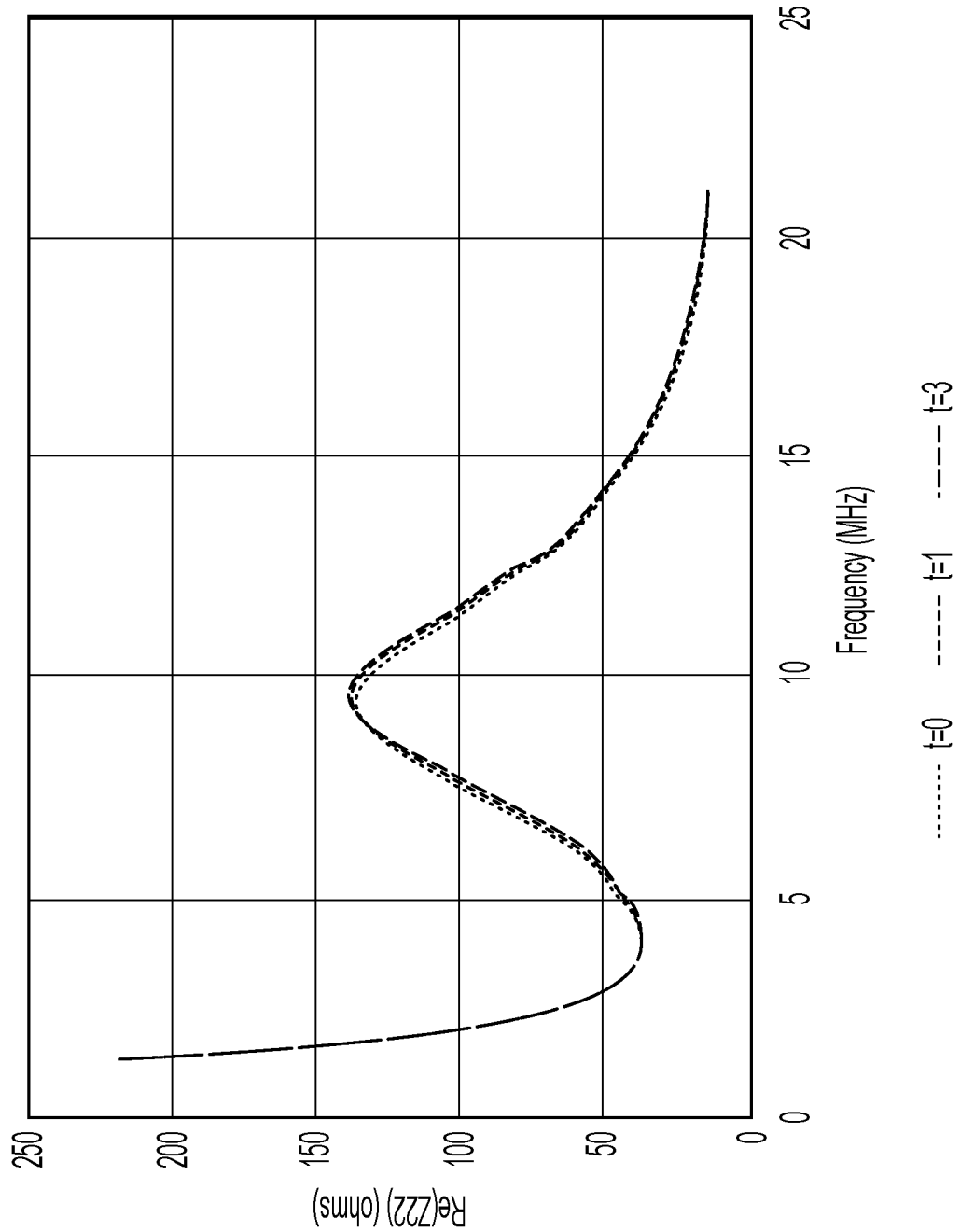
FIG. 8 depicts a plot of overlaid impedance curves taken over the course of a deposition process, according to an example.

FIG. 8 depicts a plot of overlaid impedance curves (FIG. 8 is the same as FIG. 6, except showing a greater frequency range). As shown, a first curve represents the impedance curve of probe 102 at time t=0, prior to the deposition process, a second curve represents the impedance curve of probe 102 at time t=1, at a first point during the deposition process, and third curve represents the impedance curve of prior 102 at time t=2, at a second point during the deposition process.

The shape of the curve can be represented as a set of coefficients of a polynomial representing a line-of-best fit to the curve. For example, the coefficients of a polynomial regression can be used to represent the curve; although any suitable method for fitting a polynomial to a dataset can be used. In one example, the coefficients can be stored in a lookup table and referenced to determine, for a given set of polynomial coefficients, the thickness at the time of coating $C_1$ at the time of measurement.

As mentioned above, the curve of FIG. 8 plots an impedance or a transimpedance. An impedance measurement measures the opposition of current through a particular element or set of elements of probe 102. For example, the impedance measurement can measure the impedance of an inductive or capacitive element of probe 102. By contrast, the transimpedance measures a voltage at one port resulting from a current introduced at a different port. This is particularly useful for measuring changes in mutual inductance or mutual capacitance. For example, the examples of probe 102 shown in FIGS. 3B and 3C, the mutual inductance between first coil 302 and second coil 304 or third coil 306 can be measured by the transimpedance between the first coil 302 and second coil 304 or third coil 306. The impedance or transimpedance can be measured any suitable way. For example, using the network analyzer of FIG. 1, the S-Parameters of probe 102 can be measured and converted to Z-parameters. In this example, the transimpedance between coils will be represented as Z12 or Z21. However, this is only provided as an example and any number of ways for measuring the impedance or the transimpedance can be used.

As described above, the thickness $T_1$ of coating $C_1$ on probe 102 will be related to the thickness $T_2$ of coating $C_2$ on substrate 104 by a known function such as a scaling factor or an added constant. The thickness $T_2$ can thus be determined by transforming the determined thickness $T_1$ to thickness $T_2$ by the known function. This can be accomplished by way of a mathematical operation or through a lookup table that relates thickness $T_1$ to thickness $T_2$. Alternatively, to the extent that a lookup table is used to relate a metric related to reactance (e.g., the frequency at which a resonant curve occurs or to the coefficients of an impedance curve) or resistance, the lookup table incorporate the relation between thickness $T_1$ and thickness $T_2$ so that the input parameter is directly related to thickness $T_2$.

While several inventive examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive examples described herein. It is, therefore, to be understood that the foregoing examples are presented by way of example only and that, within the scope of the appended claims and equivalents thereto, inventive examples can be practiced otherwise than as specifically described and claimed. Inventive examples of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

What is claimed is:

1. A method for in-situ measurement of a thickness of a coating deposited by a deposition process, comprising the steps of:

initiating deposition within a deposition chamber such that a first coating forms on an outer surface of a probe disposed in the deposition chamber, wherein the probe comprises a coil assembly including at least one coil, wherein the probe is separated by a distance from a substrate disposed within the deposition chamber;

exciting the coil assembly with a first alternating current to produce a first time-varying magnetic field, the first time-varying magnetic field generating an eddy current in the first coating;

determining a metric related to an inductance or resistance of the coil assembly, wherein a value of the metric is related to a first thickness of the first coating and results at least partially from an eddy current magnetic field produced by the eddy current in the first coating; and correlating the first thickness of the first coating to a second thickness of a second coating deposited on a surface of the substrate.

2. The method of claim 1, wherein the the coil assembly comprises a first coil and a second coil, wherein first coil and the second coil are wound about an axis, wherein the first coil is spaced apart from the second coil to define a gap therebetween, and wherein a third coil is disposed in the gap between the first coil and the second coil.

3. The method of claim 2, further comprising the step of exciting the second coil with a second alternating current, the second alternating current flowing in a direction opposite to the first alternating current to produce a second time-varying magnetic field that at least reduces the first time-varying magnetic field in the gap between first coil and the second coil, wherein the first alternating current excites the first coil.

4. The method of claim 3, wherein the first coil is wound about the axis in a first direction and the second coil is wound about the axis in a second direction.

5. The method of claim 4, wherein the first coil and the second coil are formed from the same conducting wire such that the first alternating current and the second alternating current are the same.

6. An electrical probe for measuring the thickness of a coating, comprising:
   a first coil being wound about an axis in a first direction and having a first number of turns;
   a second coil being wound about the axis in a second direction and having a second number of turns, wherein the first coil is spaced apart from the second coil to define a gap therebetween, wherein the first direction is opposite the second direction such that a first time-varying magnetic field generated by a first alternating current flowing through the first coil reduces, in the gap, a second time-varying magnetic field generated by a second alternating current flowing through the second coil; and
   a third coil disposed in the gap between the first coil and the second coil, wherein a coating deposited on an outer surface of the electrical probe measurably changes a metric related to a mutual inductance between the third coil and the first coil and the second coil during operation.

7. The electrical probe of claim 6, wherein the first coil and the second coil are formed by the same wire such that the first alternating current and the second alternating current are the same.

8. The electrical probe of claim 6, wherein the first number of turns are the same as the second number of turns.

9. The electrical probe of claim 6, wherein at least one of the first coil, the second coil, or the third coil is operatively connected to at least one capacitor to form a resonant circuit.

10. The electrical probe of claim 6, wherein the first coil, the second coil, and the third coil are housed in a housing comprising a body and a cap.

11. The electrical probe of claim 10, wherein the cap is removable from the body.

12. The electrical probe of claim 6, wherein the first coil, the second coil, and the third coil are wound about a threaded mandrel such that the first coil, the second coil, and the third coil are restrained in an axial direction.

13. A deposition system providing in-situ measurement of deposition thickness, comprising:
   a deposition chamber dimensioned to receive a substrate and having an inlet that receives a chemical vapor to apply a coating to a surface of the substrate;
   an electrical probe positioned in the chemical vapor deposition chamber such that an outer surface of the electrical probe is coated by the chemical vapor, wherein the electrical probe comprises a coil assembly including at least one coil, wherein the probe is separated by a distance from the substrate; and
   a signal generator supplying an alternating current signal to the coil assembly to generate a first time-varying magnetic field such that eddy currents are generated in the coating on the outer surface of the electrical probe.

14. The deposition system of claim 13, wherein the probe comprises a first coil and a second coil.

15. The deposition system of claim 14, wherein the first coil and the second coil are wound about an axis, wherein the first coil is spaced apart from the second coil to define a gap therebetween, wherein a third coil is disposed in the gap between the first coil and the second coil, wherein the coating deposited on the outer surface of the electrical probe measurably changes a metric related to mutual inductance between the third coil and the first coil and the second coil.

16. The deposition system of claim 15, wherein the first coil is wound about the axis in a first direction and the second coil is wound about the axis in a second direction.

* * * * *